(12) United States Patent
Toguchi et al.

(10) Patent No.: US 6,784,452 B2
(45) Date of Patent: Aug. 31, 2004

(54) ORGANIC THIN FILM TRANSISTOR

(75) Inventors: Satoru Toguchi, Tokyo (JP); Atsushi Oda, Tokyo (JP); Hitoshi Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/263,665

(22) Filed: Oct. 4, 2002

(65) Prior Publication Data
US 2003/0111692 A1 Jun. 19, 2003

(30) Foreign Application Priority Data
Oct. 5, 2001 (JP) .......................................... 2001-310210

(51) Int. Cl.$^7$ .............................................. H01L 51/00

(52) U.S. Cl. ......................................................... 257/40

(58) Field of Search ............................... 257/40; 438/99

(56) References Cited

U.S. PATENT DOCUMENTS 6,326,640 B1 * 12/2001 Shi et al. ....................... 257/40

FOREIGN PATENT DOCUMENTS

| JP | 5-55568 | 3/1993 |
|----|---------|--------|
| JP | 8-228034 | 9/1996 |
| JP | 8-228035 | 9/1996 |
| JP | 9-232589 | 9/1997 |
| JP | 10-125924 | 5/1998 |
| JP | 10-190001 | 7/1998 |
| JP | 2000-174277 | 6/2000 |
| JP | 2001-94107 | 4/2001 |

OTHER PUBLICATIONS

Kudo et al., "Organic static induction transistor for display devices", Synthetic Metals 111–112 (2000) 11–14, pp. 1–4.
Kudo et al., "Organic static induction transistor for color sensors", Synthetic Metals 102 (1999) 900–903, pp. 5–8.

(List continued on next page.)

Primary Examiner—Sara Crane
(74) Attorney, Agent, or Firm—McGinn & Gibb, PLLC

(57) ABSTRACT

An organic TFT including an organic film, first and second electrodes each disposed in contact with opposite surfaces of the organic film each other; and a third electrode disposed at a specified distance from each of the first and second electrodes, the third electrode being applied with a voltage to control current flowing from one of the first and the second electrodes to the other through the organic film; and the organic film including a compound represented by general formula [1]. In this TFT, the carrier moves from one of the first and the second electrodes to the other in the direction of the film thickness of the organic film. The device structure realizes the enough short channel length. The organic film provides the higher mobility, thereby the organic TFT with the sufficiently higher speed response is realized.

18 Claims, 1 Drawing Sheet

[General Formula 1]

OTHER PUBLICATIONS

Kudo et al., "Schottky gate static induction transistor using copper phthalocyanine films", Thin Solid Films 331 (1998) 51–54, pp. 9–12.

T. Sumimoto et al., "Fabrication and Characterization of Field Effect Transistors of Layered Structure Consisting of TMTSF and TCNQ", Synthetic Metals 86 (1997) 2259–2260, pp. 13–14.

A. Dodabalapur, "Organic Transistors: Two–Dimensional Transport and Improved Electrical Characteristics", Science, vol. 268, Apr. 14, 1995, pp. 15–16.

A.R. Brown, "A universal relation between conductivity and field–effect mobility in doped amorphous organic semiconductors", Synthetic Metals 68 (1994) 65–70, pp. 17–22.

Francis Garnier et al., "All–Polymer Field–Effect Transistor Realized by Printing Techniques", Science, vol. 265, Sep. 16, 1994, pp. 23–25.

H. Koezuka et al., "Polythiophene field–effect transistor with polypyrrole worked as source and drain electrodes", Appl. Phys. Lett. 62 (15), Apr. 12, 1993, pp. 1–3.

H. Fuchigami et al., "Polythienylenevinylene thin–film transistor with high carrier mobility", Appl. Phys. Lett. 63 (10), Sep. 6, 1993, pp. 1–3.

Gilles Horowitz et al., "Thin–Fillm Transistors Based on Alpha–Conjugated Oligomers", Synthetic Metals, 41–43 (1991) pp. 1127–1130.

S. Miyauchi et al., "Junction Field–Effect Transistor Using Polythiophene as an Active Component", Synthetic Metals, 41–43 (1991) pp. 1155–1158.

Xuezhou Peng et al., "All–organic thin–film transistors made of alpha–sexithienyl semiconducting and various polymeric insulating layers", Appl. Phys. Lett. 57 (19), Nov. 5, 1990, pp. 1–3.

Gerard Guillaud et al., "Field–Effect Transistors Based on Intrinsic Molecular Semiconductors", Chemical Physics Letters, vol. 167, No. 6, Apr. 13, 1990, pp. 1–4.

A. Assadi et al., "Field–effect mobility of poly(3–hexylthiophene)", Appl. Phys. Lett. 53 (3), Jul. 18, 1998, pp. 1–3.

F. Ebisawa et al., "Electrical properties of polyacetylene/polysiloxane interface", J. Appl. Phys. 54, Jun. 6, 1993, pp. 1–5.

* cited by examiner

ORGANIC THIN FILM TRANSISTOR

BACKGROUND OF THE INVENTION (a) Field of the Invention

The present invention relates to an organic thin film transistor (TFT) having an organic semiconductor layer (organic film), more specifically to the organic TFT operating at a higher speed and a higher frequency.

(b) Description of the Related Art

A TFT is widely used as a switching device in display device such as an LCD. Conventional TFTs are made of amorphous or polycrystalline silicon. A CVD apparatus for fabricating the TFTs is expensive, and the fabrication of the large-sized display having the TFTs accompanies significant increase of the fabrication cost. Because of the film formation of the amorphous or polycrystalline silicon conducted at a higher temperature, some kinds of substrates, such as a resin substrate, cannot be used in the TFT or excludes a light-weight resin substrate A TFT using organic compounds in place of the amorphous or polycrystalline silicon has been proposed for overcoming the above problems. The vacuum deposition technique and the coating technique are known for forming the film by using the organic compounds. These techniques can realize the larger devices while suppressing the cost increase, and in addition can decrease the temperature required for the film formation. Accordingly, the restriction of the substrate materials is advantageously alleviated in the TFT using the organic compounds, and the practical application thereof is expected.

In recent years, the TFTs having the organic compounds have been frequently reported. Examples thereof include Journal of Applied Physics, 54, p3255, 1983 (F. Ebisawa, et.al), Applied Physics Letter, 53, p195, 1988 (A. Assadi, et.al), Chemical Physics Letter, 167, p503, 1990 (G. Guillaud, et.al), Applied Physics Letter, 57, p2013, 1990 (X.Peng, et.al), Synthetic Metals, 41 to 43, p1127, 1991 (G. Horowitz, et.al), Synthetic Metals, 41 to 43, 1991 (S. Miyauti, et.al), Applied Physics Letter, 63, p1372, 1993 (H. Futigami, et.al), Applied Physics Letter, 62, p1794, 1993 (H. Koezuka, et.al), Science, 265, p1684, 1994 (F. Garnier, et.al), Synthetic Metals, 68, p65, 1994 (A. R. Brown, et.al), Science, 268, p270, 1995 (A. Dodabalapur, et.al), Synthetic Metals, 86, p2259, 1997 (T. Sumitomo, et.al), Thin Solid Films, 331, p51, 1998 (K. Kudo, et.al). Synthetic Metals, 102, p900, 1999 (K. Kudo, et.al) and Synthetic Metals, 111 to 112, p11, 2000 (K. Kudo, et.al.

Dimers to polymers such as conjugated polymers and thiophenes (JP-A-8(1996)-228034, 8(1996)-228035, 9(1997)-232589, 10(1998)-125924 and 10(1998)-190001), metal phthalocyanine compounds (JP-A-2000-174277), and condensed aromatic hydrocarbons such as pentacene (JP-A-5(1993)-55568 and 2001-94107) are used as the organic compound of the TFT, in the form of a mixture with other compounds or a single substance.

As shown in FIG. 1, an organic TFT 20 includes a gate electrode (layer) 24 and a dielectric layer 26 in this turn on a substrate 21. A source electrode 22 and a drain electrode 23 are separately mounted on the dielectric layer 26. An organic film 25 is formed on the surfaces of the electrodes 22,23 and on the exposed surface of the dielectric layer 26 between the electrodes 22,23. In the organic TFT 20 having the above configuration, the organic film 25 forms a channel region, and the on/off operation is conducted by controlling current flowing between the source electrode 22 and the drain electrode 23 by means of a voltage applied to the gate electrode 24.

In the conventional organic TFT 20, the carrier (free electrons or holes) moves in a direction of the surface of the organic film 25 shown by an arrow "A" in FIG. 1 and the channel length is too long for carrier mobility in the channel region made of organic compounds. Accordingly, the high-speed and high-frequency operation has not be realized. Further, the conventional organic TFT in which the carrier moves in a direction of the thickness of the organic thin film layer has increased response speed because of the shortened channel length. However, also in this case, the sufficient driving speed cannot be realized because of the insufficient mobility of the organic compound

SUMMARY OF THE INVENTION

It is therefore an object of the present invention to provide a high-speed and high-frequency organic TFT having shortened the channel length and including the compound with the higher mobility.

The inventors found that, after extensive investigations, when the carrier which moves from one electrode to the other one moves in the direction of the thickness of the organic thin film and the organic thin film of the TFT contains a compound having a specified structure in the form of a mixture or a single substance, the response speed of the organic TFT is significantly improved.

Thus, the present invention provides an organic TFT including a substrate, an organic film supported by the substrate, first and second electrodes each disposed in contact with opposite surfaces of the organic film each other, and a third electrode disposed at a specified distance from each of the first and second electrodes, the third electrode being applied with a voltage to control carriers moving from one of the first electrode and the second electrode to the other through the organic film; and the organic film including, in the form of a mixture or a single substance, a compound represented by at least one of general formulae [1] to [6], wherein each of $R^1$ to $R^{80}$ independently represents hydrogen atom, halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group or substituted or non-substituted alkoxycarbonyl group or carboxyl group; any two adjacent groups of $R^1$ to $R^{80}$ may form a ring; "$L^1$" represents substituted or non-substituted alkyl group, substituted or non-substituted alkenyl group, substituted or non-substituted cycloalkyl group, substituted or non-substituted aromatic hydrocarbon group, substituted or non-substituted aromatic heterocyclic group or substituted or non-substituted aralkyl group; "$L^2$" represents substituted or non-substituted alkylene group, substituted or non-substituted alkenylene group, substituted or non-substituted cycloalkylene group, substituted or non-substituted arylene group or substituted or non-substituted aralkylene group; "$Ar^1$" to "$Ar^3$" represent substituted or non-substituted aromatic hydrocarbon group having carbons from 6 to 20; "n" represents an integer from 1 to 3; "m" represents an integer from 0 to 2; "l" is 0 or 1; "s" is 1 or 2; "t" represents an integer from 0 to 3; and "M" represents a metal ion having a valency of "n+m" or "s+1".

[General Formula 1]
[General Formula 2]
[General Formula 3]
[General Formula 4]
[General Formula 5]
[General Formula 6]

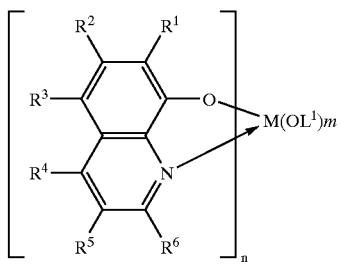

[1]

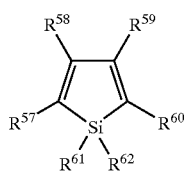

[5]

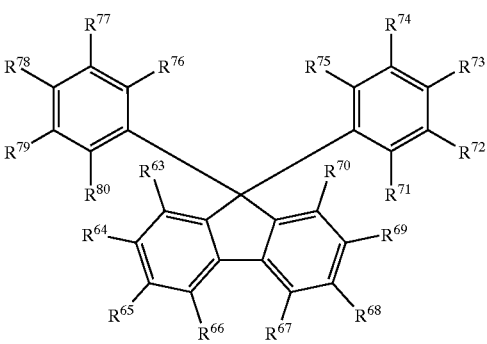

[6]

In the present invention, the compound represented by the general formulae [1] to [6] can be replaced with a compound selected from substituted or non-substituted condensed aromatic hydrocarbons having carbons from 14 to 34.

In accordance with the organic TFT of the present invention, the carrier moves from one of the first and second electrodes to the other in the direction of the film thickness of the organic film. The device structure realizes the enough short channel length. The organic film containing the compound represented by at least one of general formulae [1] to [6] or substituted or non-substituted condensed aromatic hydrocarbons having carbons from 14 to 34, in the form of a mixture or a single substance provides the higher carrier mobility thereby the organic TFT with the sufficiently higher speed response is realized.

The above and other objects, features and advantages of the present invention will be more apparent from the following description.

PREFERRED EMBODIMENTS OF THE INVENTION

Now, the present invention is more specifically described with respect to preferred embodiments of the present invention.

First Embodiment

Figure 1:
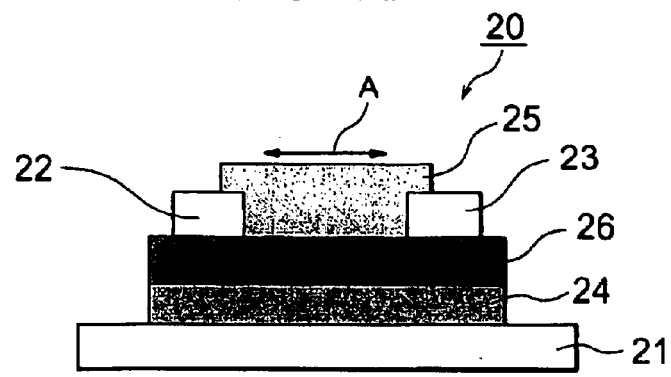
FIG. 1 is a cross sectional view showing a conventional organic TFT.
Figure 2:
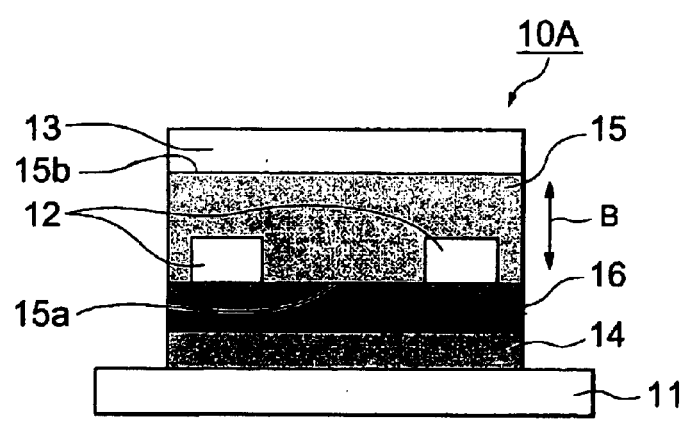
FIG. 2 is a cross sectional view showing an organic TFT in accordance with a first embodiment of the present invention.

As shown in FIG. 2, an organic TFT 10A having a structure of FET (Field Effect Transistor) includes a stacked structure on a substrate 11. The stacked structure includes a gate electrode 14 and a dielectric layer 16 in this turn on the substrate 11, and striped source electrodes (first electrodes) 12 are separately mounted on the dielectric layer 16. Further, an organic film (organic compound layer) 15 is formed on the surfaces of the source electrodes 12 and on the exposed surface of the dielectric layer 16, and a drain electrode (second electrode) 13 is formed on the organic film 15. The source electrodes 12 are in contact with the side and bottom surface of the organic film 15 and the drain electrode 13 is in contact with the top surface 15b of the organic film 15.

In the organic TFT 10A having the above configuration, the organic film 15 forms a channel region, and the on/off operation is conducted by controlling current flowing from one of the source electrodes 12 and the drain electrode 13 to the other by means of a voltage applied to the gate electrode 14.

Examples of the materials used for the source electrode 12, the drain electrode 13 and the gate electrode 14 include materials such as indium oxide-thin alloy (ITO), tin oxide (NESA), gold, silver, platinum, copper, indium, aluminum, magnesium, magnesium-indium alloy, magnesium-aluminum alloy, aluminum-lithium alloy, aluminum-scandium-lithium alloy and magnesium-silver alloy; and organic materials such as conductive polymer, and are not restricted thereto. Examples of the materials used for the dielectric layer 16 acting as a gate dielectric layer include inorganic insulators such as $SiO_2$, $SiN_x$ and alumina; and dielectric polymer, and are not restricted thereto.

The organic TFT 10A of the present embodiment has the structure in which the moving direction of the carrier is consistent with the direction of the thickness of the organic film shown by an arrow "B" in FIG. 2, and the organic film contains the coin pound represented by at least one of general formulae [1] to [6] or substituted or non-substituted condensed aromatic hydrocarbons having carbons from 14 to 34, in the form of a mixture or a single substance.

[General Formula 1]
[General Formula 2]
[General Formula 3]
[General Formula 4]
[General Formula 5]
[General Formula 6]

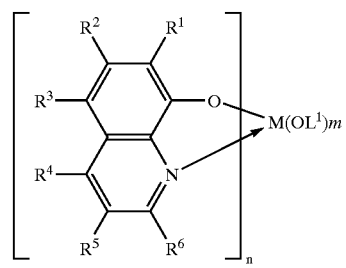

[1]

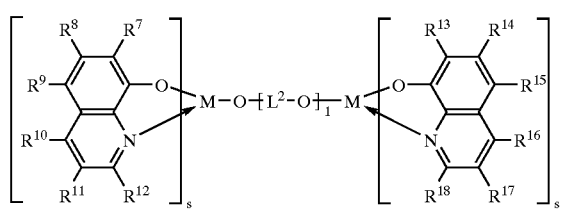

[2]

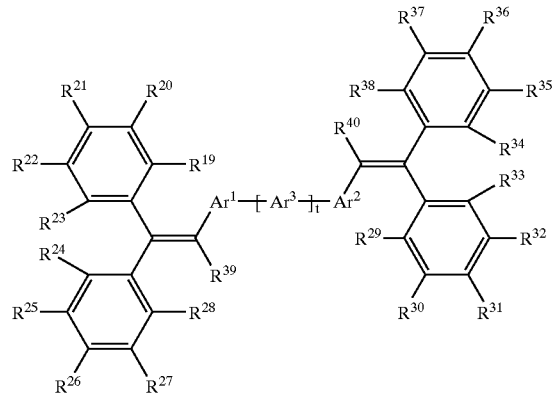

[3]

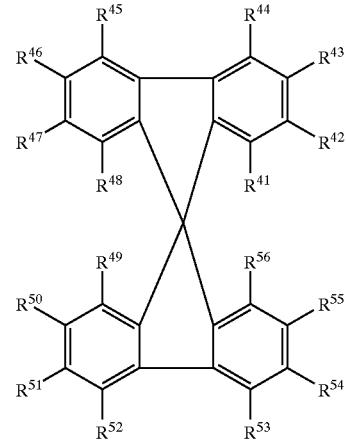

[4]

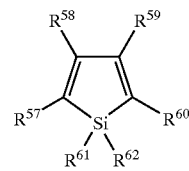

[5]

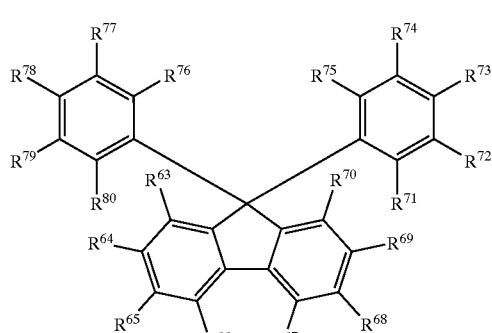

[6]

In the general formulae [1] to [6], each of $R^1$ to $R^{80}$ independently represents hydrogen atom, halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group or substituted or non-substituted alkoxycarbonyl group or carboxyl group. Any two adjacent groups of $R^1$ to $R^{80}$ may form a ring. "n" represents an integer from 1 to 3, and "m" represents an integer from 0 to 2. "l" is 0 or 1 and "s" is 1 or 2. "t" represents an integer from 0 to 3; and "M" represents a metal ion having a valency of "n+m" or "S+1".

In the general formulae [1] to [6], each of $Ar^1$ to $Ar^3$ independently represents substituted or non-substituted aromatic hydrocarbon group having carbons from 6 to 20.

Examples of the substituted or non-substituted aromatic hydrocarbon group having carbons from 6 to 20 include phenyl group, naphthyl group, anthryl group, phenanthrenyl group, pyrenyl group and perylenyl group.

Examples of substituents of these aromatic hydrocarbon group having carbons from 6 to 20 include halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group or substituted or non-substituted alkoxycarbonyl group and carboxyl group.

Examples of the condensed aromatic hydrocarbons having carbons from 14 to 34 include anthracene, phenanthrene, naphthacene, pentacene, pyrene, chrysene, picene, pentaphene, hexacene, perylene, benzo[a]perylene, dibenzo[a,j]perylene, dibenzo[a,o]perylene, bisanthrene, pyranthrene, tetrabenzo[de,[hi, op, st] pentacene and coronene.

Examples of substituents of these condensed aromatic hydrocarbon group include halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group or substituted or non-substituted alkoxycarbonyl group and carboxyl group.

The halogen atom includes fluorine atom, chlorine atom, bromine atom and iodine atom.

The substituted or non-substituted amino group is expressed by —$NX_1X_2$, wherein each of given $X_1$ and $X_2$ independently represents hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoetbyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromnethyl group, 1-nitroethyl group, 2-nitroethyl group, 2-nitroisobutyl group, 1,2-dinitroethyl group, 1,3-dinirtroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-l-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-inidolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranvl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalillyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridiniyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthrloline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline 3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8 phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthioline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phelnoxazinyl group, 4-phenoxazinyl group, 2-oxazolyl group, 4-oxazolyl group, 5-oxazolyl group, 2-oxadiazolyl group, 5-oxadiazolyl group, 3-hurazanyl group, 2 thienyl group, 3-thienyl group, 2-methylpyrrole-1-yl group, 2-methylpyyrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl1-indolyl group, 2-t-butyl3-indolyl group, and 4-t-butyl3-indolyl group.

Examples of the substituted or non-substituted alkyl group include methyl group, ethyl group, propyl group, isopropyl group, n-butyl, s-butyl, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromno-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group. 2-cyanoethyl group, 2-cyanoisobutyl group, 1,2-dicyanoehtyl group, 1,3-dicyanoisopropy group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro t butyl group, and 1,2,3-trinitropropyl group.

Examples of the substituted or non-substituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, 3-phenyl-1-butenyl group, 4-methylphenylvinyl group, 2,2-di-p-tolylvinyl group and cyclohexylidene methine group.

Examples of the substituted or non-substituted cycloalkyl group include cyclopropyl group, cyclobutyl 1O group, cyclopentyl group, cyclohexyl group and 4-methylcyclohexyl group.

Examples of the substituted or non-substituted alkoxy group include groups represented by —OY wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibroino-t-butyl group, 1,2,3-tribromopropyl group, iodomethyl group, 1-iodoethyl group, 2-iodoethyl group, 2-iodoisobutyl group, 1,2-diiodoethyl group, 1,3-diiodo isopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triamiinopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted aromatic hydrocarbon group include phenyl group, 1-naphthyl group, 2-naphthyl group, 1-anthryl group, 2-anthryl group, 9-anthryl group, 1-phenanithryl group, 2-phenanthryl group, 3-phenanthryl group, 4-phenanthryl, group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthril group, 4'-methylbiphenylyl group and 4"-t-butyl-p-terphenyl-4-yl group.

Examples of the substituted or non-substituted aromatic heterocyclic group include 1-pyrrolyl group, 2-pyrrolyl group, 3-pyrrolyl group, pyrizinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinxoxalinyl group, 5-quinoxalinyl group, 6-quinoxalinyl group, 1-carbazolyl group, 2-carbazolyl group, 3-carbazolyl group, 4-carbazolyl, group, 9-carbazolyl group, 1-phenanthridinyl- group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridityl group, 2-acridinyl group, 3-acridinyl group, 4-acridinyl group, 9-acridinyl group, 1,7-phenanthroline-2-yl group, 1,7-phenanthroline-3-yl group, 1,7-phenaianthroliine-4-yl group, 1,7-phenanthroline-5-yl group, 1,7-phenanthroline-6-yl group, 1,7phenanthroline-8-yrl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenianthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phienanthroline-5-yl group, 2,9-phenanthroline-6-yl group, 2,9-pheleanithroline-7-yl group, 2,9-phenanthroline-8-yl group, 2,9-phenarithroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenaothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-mehyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or non-substituted aralkyl group include benzyl group, 1-phenylethyl group, 2-phenylethyl group, 1-phenylisopropyl group, 2-phenylisopropyl group, phenyl-t-butyl group. α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphlithylethyl group, 2-β-naphtbylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or non-substituted aryloxy group is represented by —OZ, wherein Z may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenainthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthiroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanlthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthrolinee-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phonothiazinyl group, 1-phenioxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted or non-substituted alkoxycarbonyl group is represented by —COOY$^2$, wherein Y$^2$ may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of metal atom represented by "M" include aluminum, beryllium, bismuth, cadmium, cerium, cobalt, copper, iron, gallium, germanium, mercury, indium, lanthanum, magnesium, molybdenum, niobium, antimony, scandium, tin, tantalum, thorium, titanium, uranium, tungsten, zirconium, vanadium and zinc.

Although examples of the compounds of the present invention will be listed, the compounds are not restricted thereto.

Examples of the compounds include the structures represented by the formula (1') to (48').

[General Formula 1']
[General Formula 2']
[General Formula 3']
[General Formula 4']
[General Formula 5']
[General Formula 6']
[General Formula 7']
[General Formula 8']
[General Formula 9']
[General Formula 10']
[General Formula 11']
[General Formula 12']
[General Formula 13']
[General Formula 14']
[General Formula 15']
[General Formula 16']
[General Formula 17']
[General Formula 18']
[General Formula 19']
[General Formula 20']
[General Formula 21']
[General Formula 22']
[General Formula 23']
[General Formula 24']
[General Formula 25']
[General Formula 26']
[General Formula 27']
[General Formula 28']
[General Formula 29']
[General Formula 30']
[General Formula 31+]
[General Formula 32']
[General Formula 33']
[General Formula 34']
[General Formula 35']
[General Formula 36']
[General Formula 37']
[General Formula 38']
[General Formula 39']
[General Formula 40']
[General Formula 41']
[General Formula 42']
[General Formula 43']
[General Formula 44']
[General Formula 45']
[General Formula 46']
[General Formula 47']
[General Formula 48']

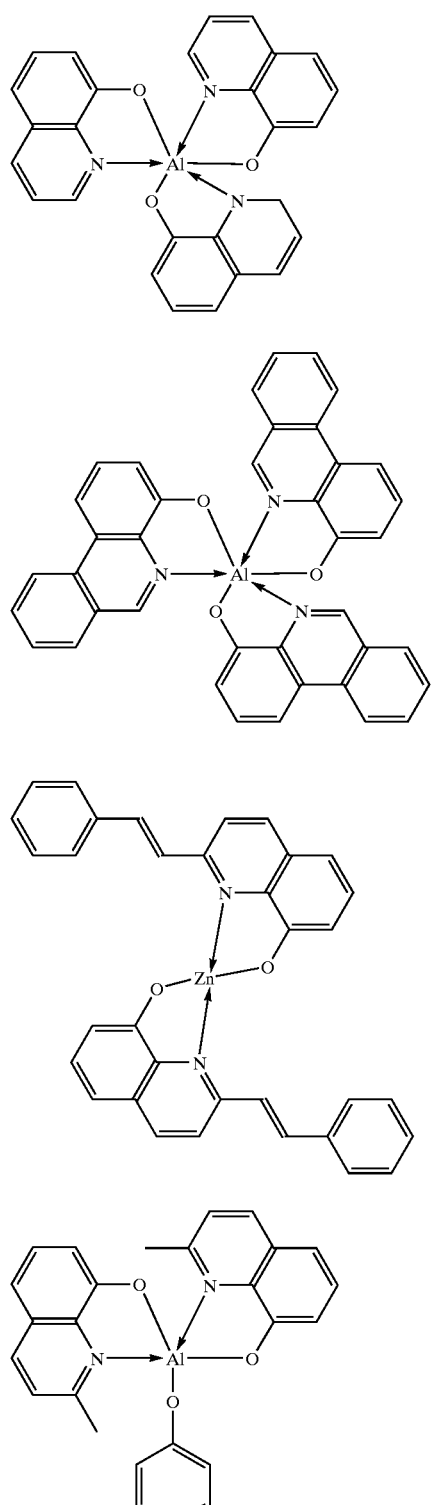

-continued
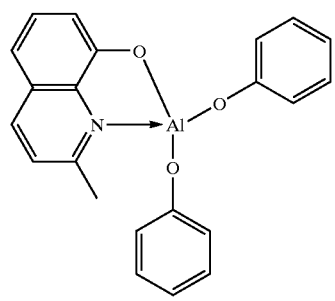
(9')
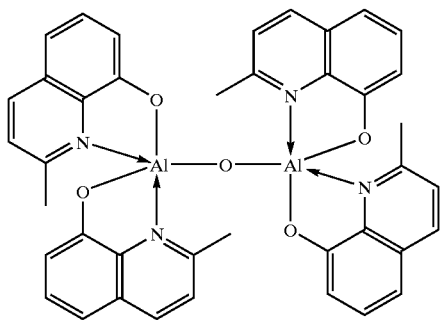
(10')
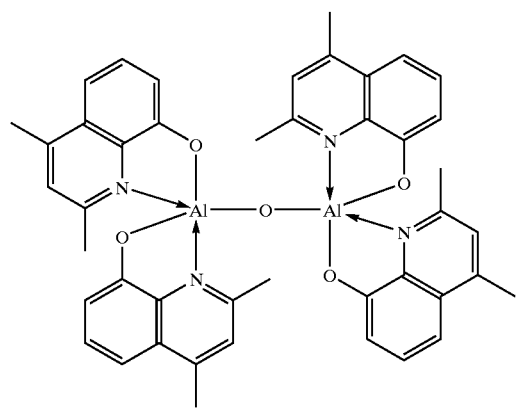
(11')
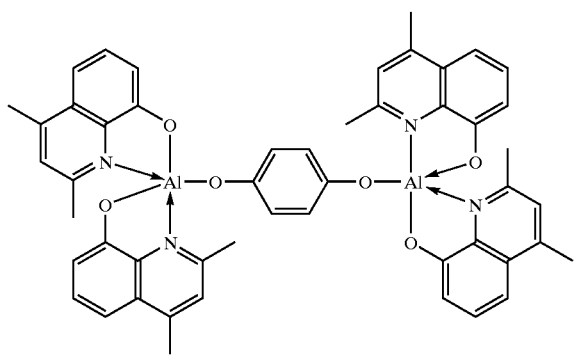
(12')
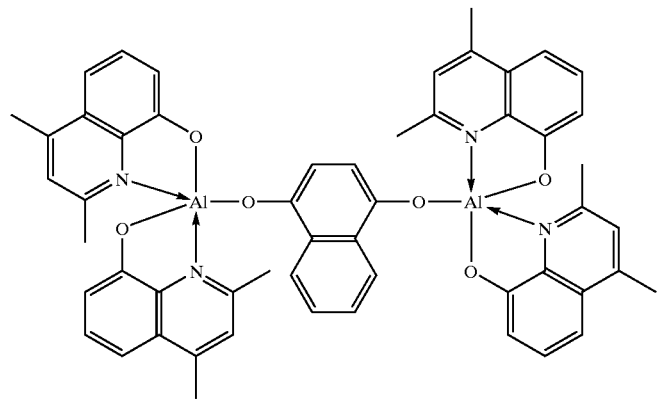
(13')
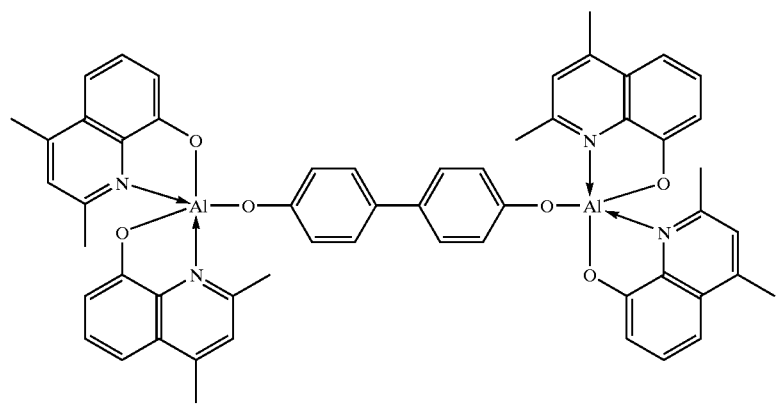
(14')

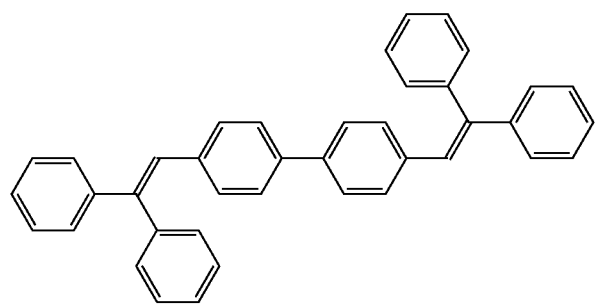
(15')
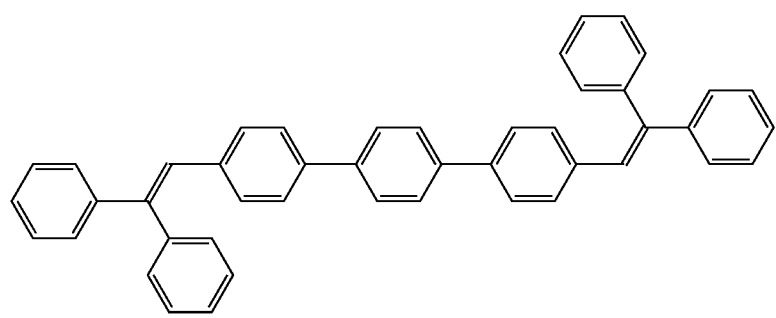
(16')
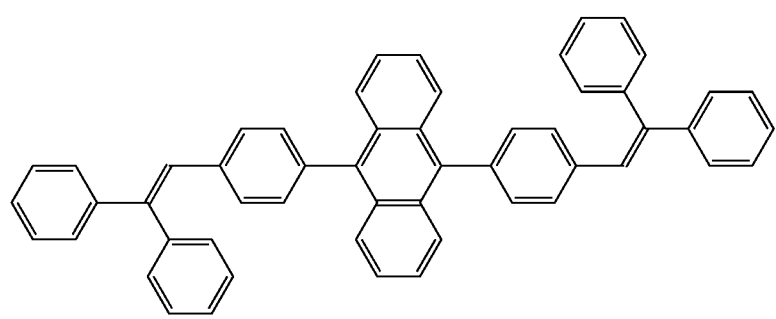
(17')
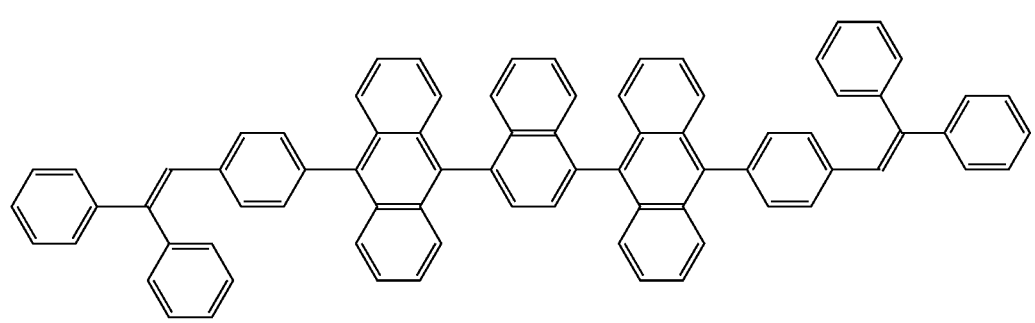
(18')

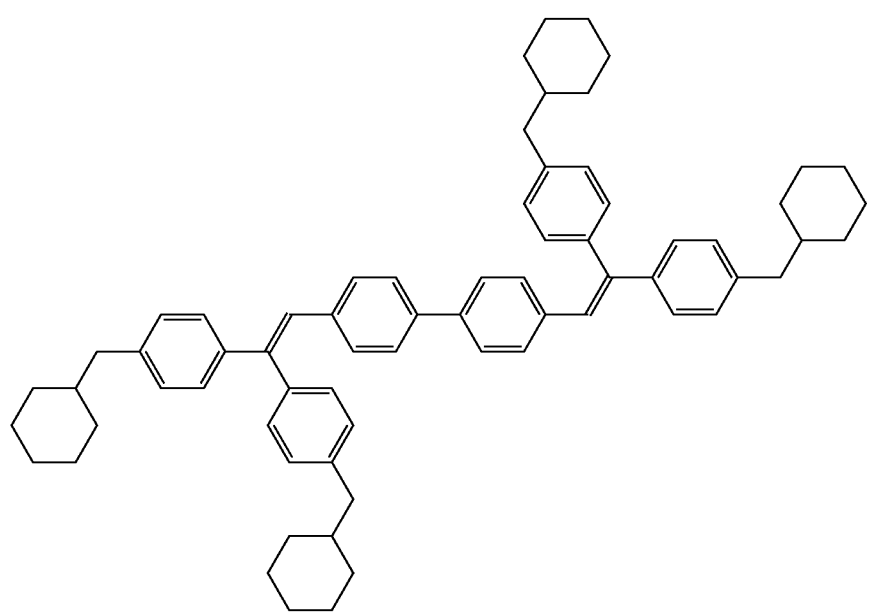
(19')
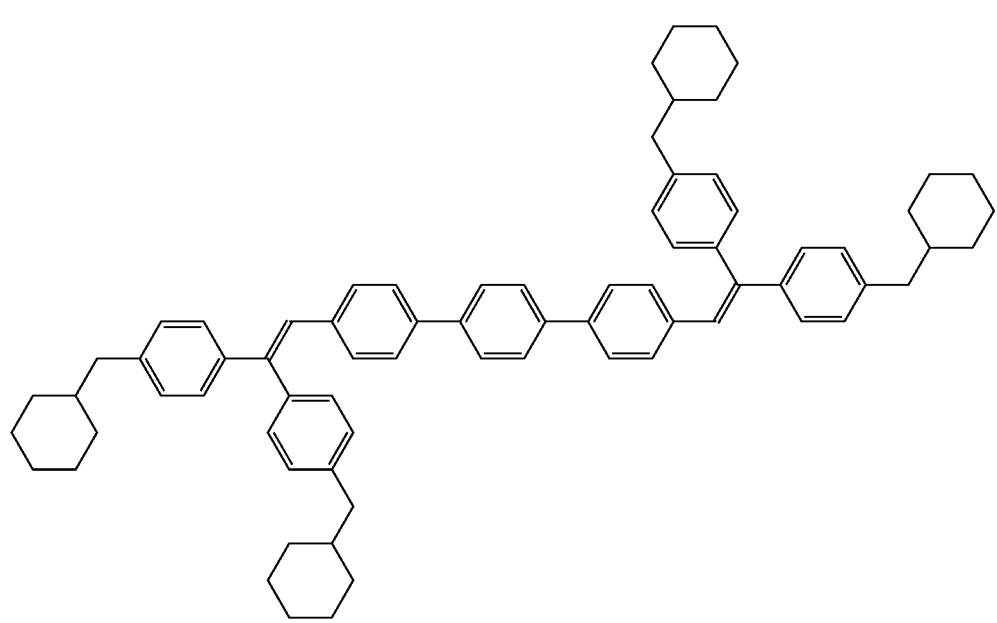
(20')

-continued
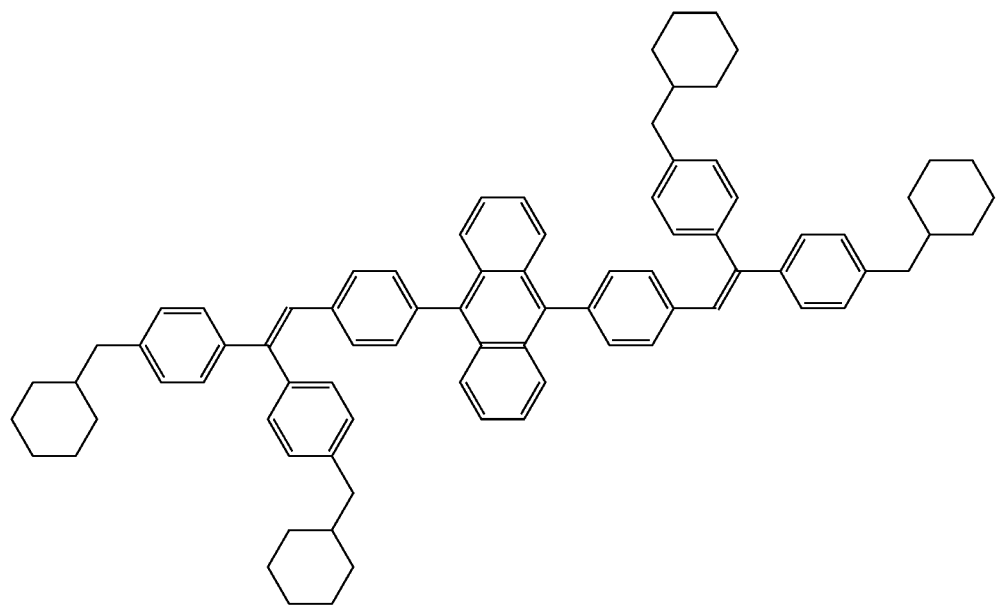
(21')
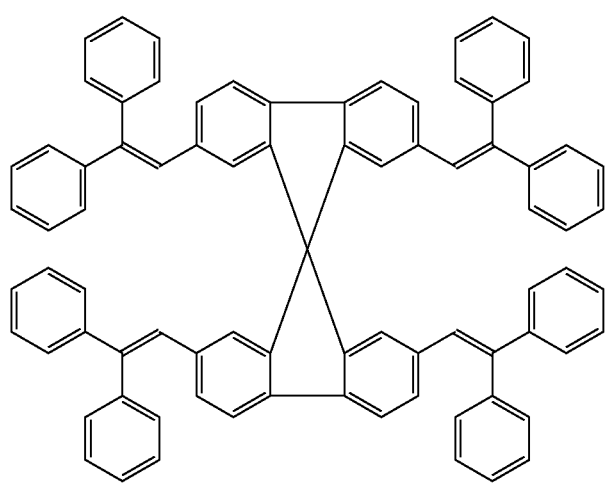
(22')
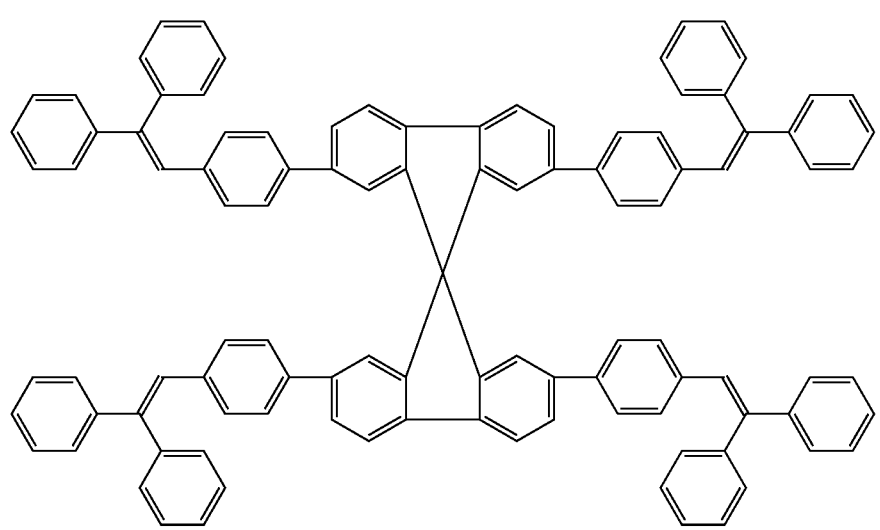
(23')

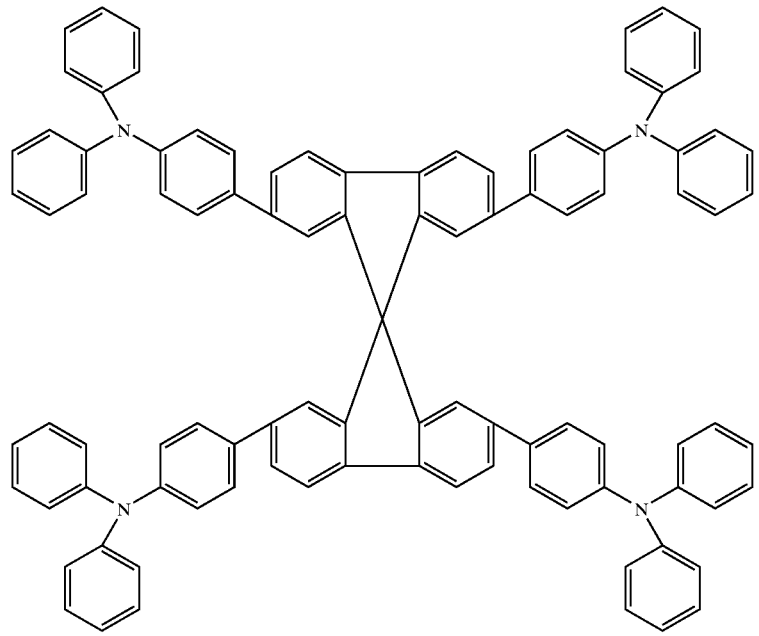
(24')
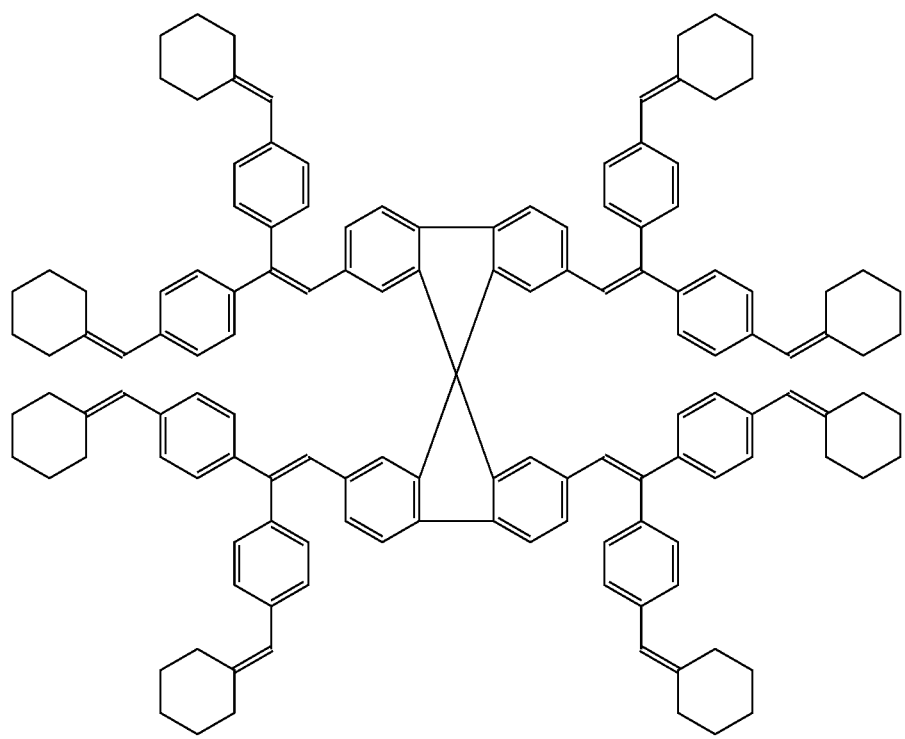
(25')

-continued
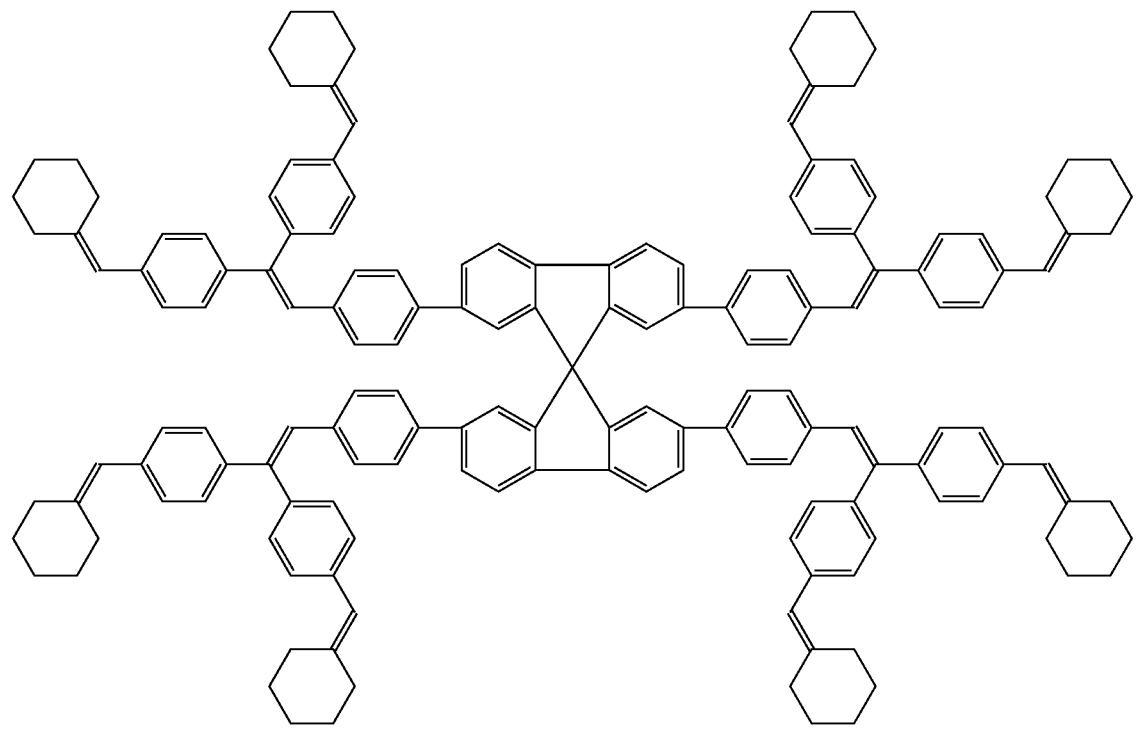
(26')
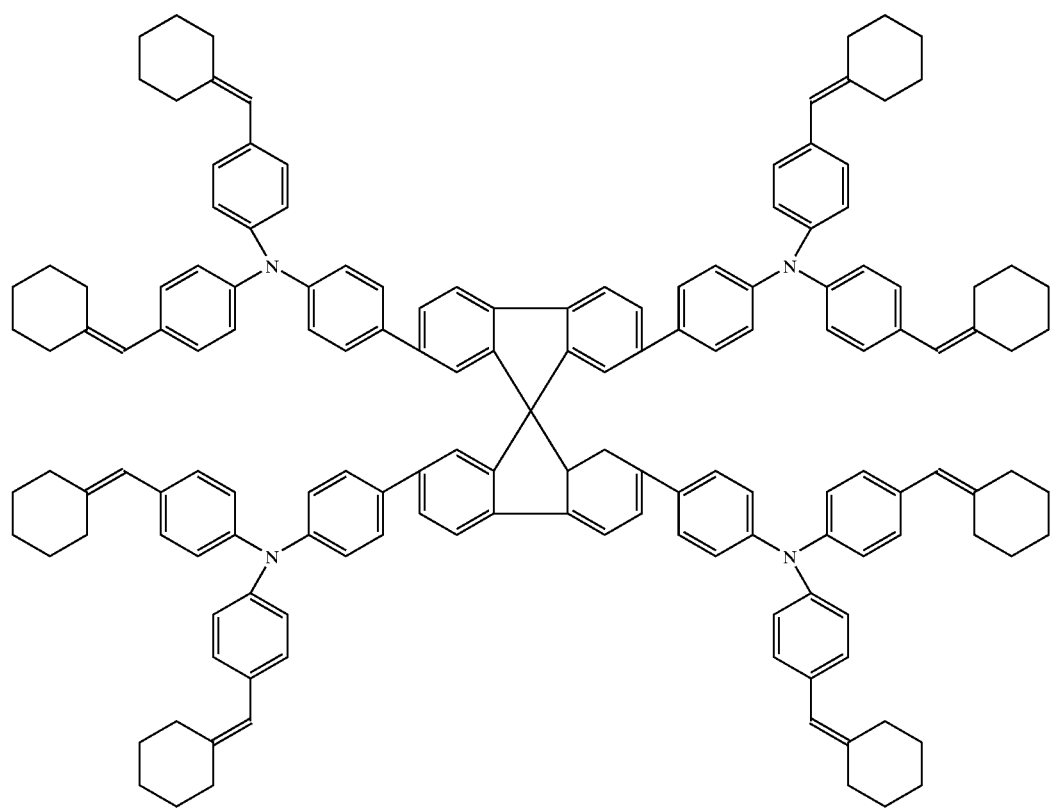
(27')

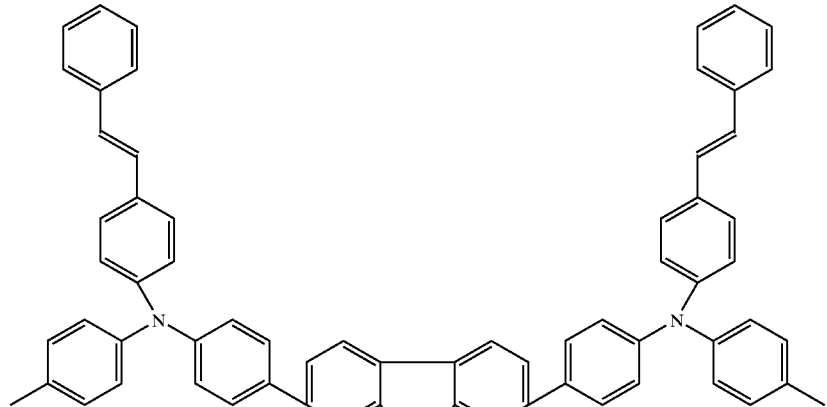
(28')
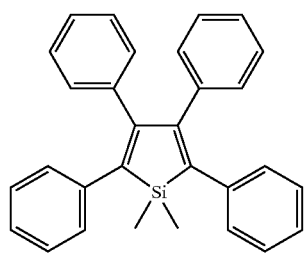
(29')
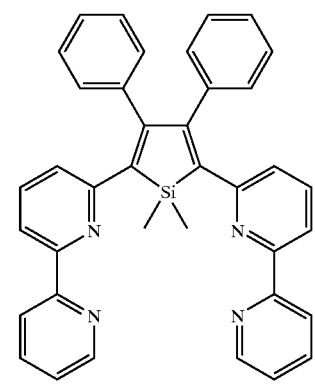
(30')

-continued
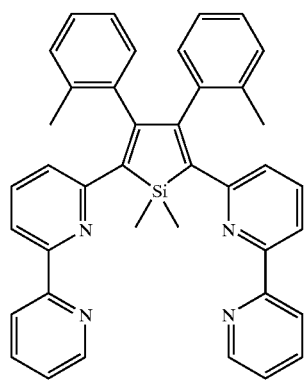 (31')
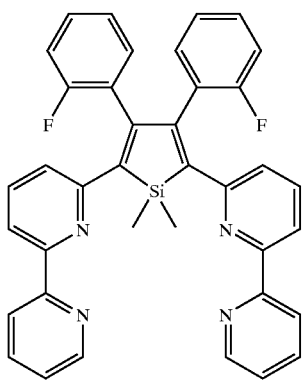 (32')
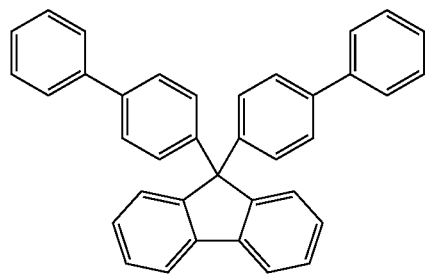 (33')
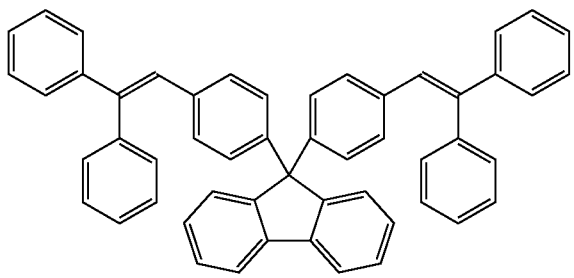 (34')
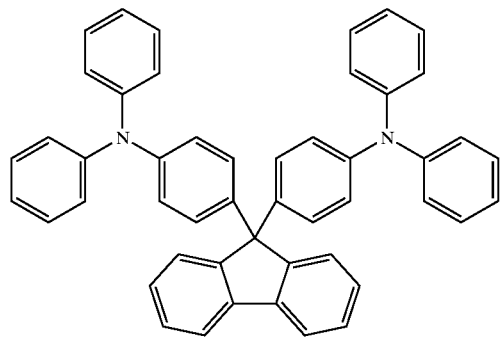 (35')
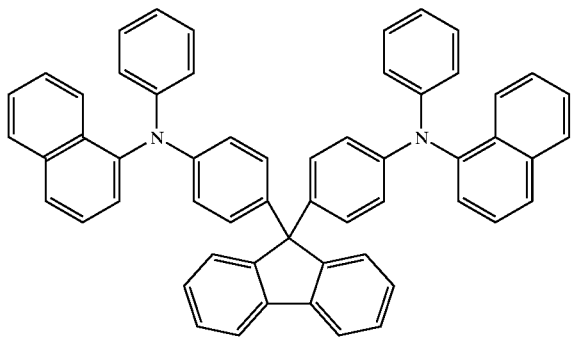 (36')
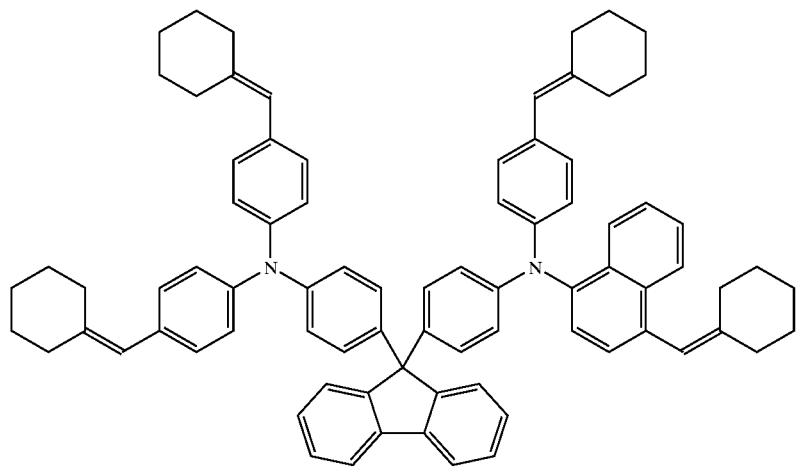 (37')

-continued

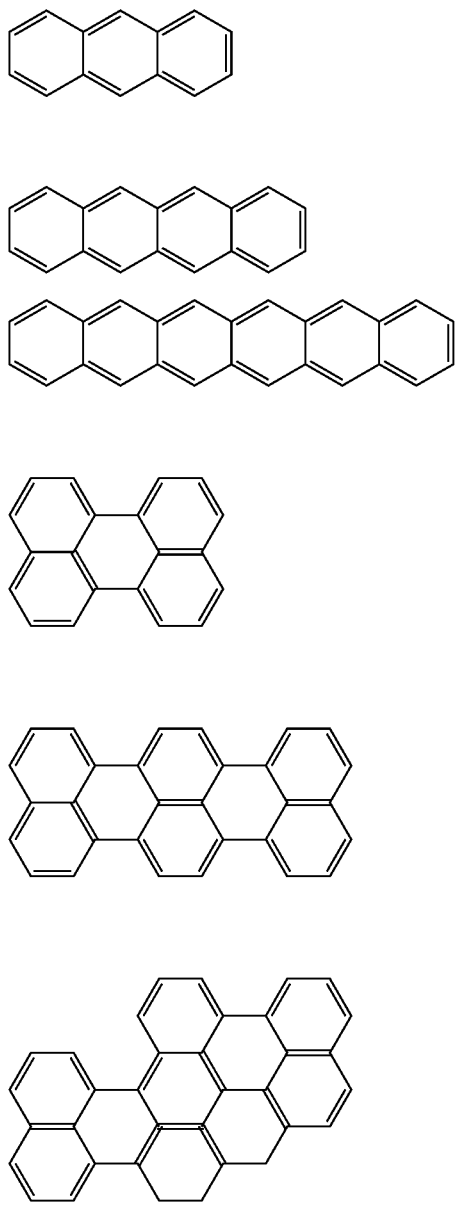
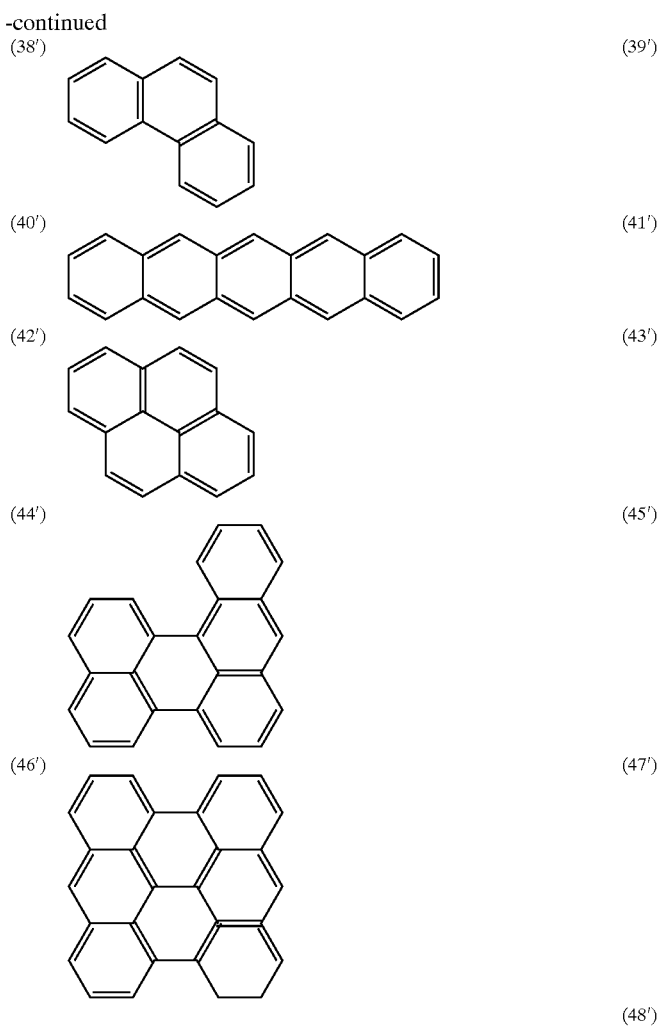

Second Embodiment

Figure 3:
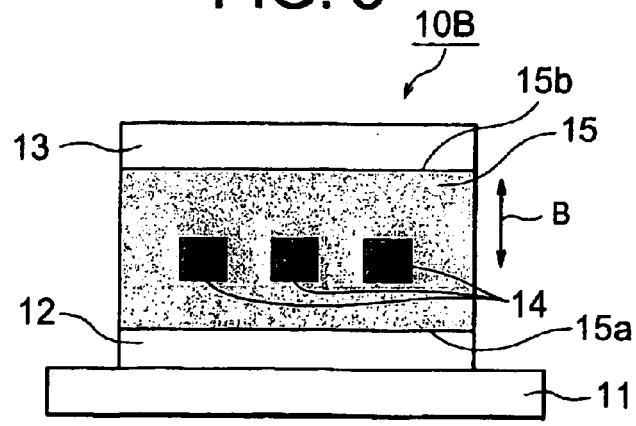
FIG. 3 is a cross sectional view showing an organic TFT in accordance with a second embodiment of the present invention.

As shown in FIG. 3, according to the present embodiment, an organic TFT 10B with a structure of SIT (Static Induction Transistor) has a stacked structure on a substrate 11. The stacked structure includes an organic film 15 having a source electrode 12 on its bottom surface 15a and a drain electrode 13 on its top surface 15b. The organic film 15 includes therein a plurality of striped gate electrodes 14 to which a voltage is applied for controlling current flowing from one of the source electrode 12 and the drain electrode 13 to the other. The gate electrodes 14 extending perpendicular to this section appearing in FIG. 3 are parallel to one another and to the source electrode 12 and the drain electrode 13.

Similarly to the first embodiment, the organic film 15 constitutes the channel region of the organic TFT 10B of the present embodiment and the gate electrode 14 is applied with a voltage to control carriers moving from one of the electrodes 12 and 13 to the other through the organic film.

The materials used for the source electrodes 12, the drain electrode 13 and the gate electrodes 14, and the compound contained in the organic film 15 of the present embodiment are similar to those of the first embodiment.

The techniques for forming the each layer (electrode) of the organic TFTs 10A,10B of the first and second embodiments are not specifically restricted, and the conventional film forming methods such as the vacuum deposition method and the spin coating method can be employed. The organic film 15 can be formed by using the coating method such as the dipping, the spin coating, the casting, the bar coating and the roll coating; the vacuum deposition method or the molecular beam epitaxy method (MBE method).

The thicknesses of the organic TFTs 10A,10B are not specifically restricted. The thinner layer generally produces the defect such as pinholes, and the thicker layer increases the channel length or requires the higher applied voltage. Accordingly, the preferable thickness is from several nm to 1 µm.

The substrates 11 of the embodiments supporting the organic TFT structures may be made of glass, plastics and metal. When the organic TFT structure can be supported by an element other than the substrate 11 shown in the drawings, such an element is used in place of the illustrated substrate 11.

EXAMPLES

Although Examples of the present invention will be described, the present invention shall not be restricted thereto.

Example 1

The organic TFT 10A of the first embodiment shown in FIG. 2 was fabricated in the following procedures.

The gate electrode 14 having thickness of 100 nm was formed by vacuum-deposition of chromium on the substrate 11. Then, $SiO_2$ film was formed on the gate electrode 14 by sputtering to form the dielectric layer 16 having thickness of 300 nm. A magnesium-silver alloy was vacuum-deposited on the dielectric layer 16 through a metal mask to form the striped source electrodes 12 having thicknesses of 100 nm.

Then, the compound (1') was vacuum-deposited on the dielectric layer 16 and the source electrodes 12 to form the organic film 15 having thickness of 300 nm. Further, magnesium-silver alloy was vacuum-deposited on the organic film 15 to form the drain electrode 13 having thickness of 200 nm, thereby fabricating the organic TFT 10A.

A rectangular pulse voltage having a frequency of 1 kHz and a maximum voltage of 8.5 V was applied to the gate electrode 14 and a dc voltage of 10 V was applied to between the source and the drain electrodes of the above organic TFT 10A. A response rise-time (a period of time from 10% change to 90% change with respect to the total change) of the on-state between the source-drain electrodes was measured to be below 1 μs.

Example 2

The organic TFT was fabricated in accordance with the procedures of Example 1 except that the compound (3') was used in place of the compound (1'). The response rise-time of the on-state between the source-drain electrodes of the organic TFT was measured to be below 1 μs similarly to Example 1.

Example 3

The organic TFT was fabricated in accordance with the procedures of Example 2 except that the compound (5') was used in place of the compound (3'). The response rise-time of the on-state between the source-drain electrodes of the organic TFT was measured to be below 1 μs similarly to Example 2.

Examples 4 to 29

The organic TFTs were similarly fabricated in accordance with the procedures of the above Examples in which the numbers of the formulae of the compounds used and the materials of the source electrode and the drain electrode (electrode material) were as specified in Table 1. The response times of each of these organic TFTs were summarized in Table 1.

As apparent from Table 1, the response times of the organic TFTs of Examples 4 to 29 were significantly short, or below 1 μs similarly to Examples 1 to 3.

TABLE 1

| Example | No. of Compound | Electrode Material | Response Time (μs) |
|---|---|---|---|
| 4 | 8' | MgAg | <1 |
| 5 | 10' | MgAg | <1 |
| 6 | 14' | MgAg | <1 |
| 7 | 15' | Au | <1 |
| 8 | 16' | Au | <1 |
| 9 | 18' | Cu | <1 |
| 10 | 19' | Au | <1 |
| 11 | 20' | ITO | <1 |
| 12 | 22' | Cu | <1 |
| 13 | 23' | Au | <1 |
| 14 | 24' | ITO | <1 |
| 15 | 25' | Au | <1 |
| 16 | 26' | Au | <1 |
| 17 | 27' | ITO | <1 |
| 18 | 28' | Cu | <1 |
| 19 | 29' | MgAg | <1 |
| 20 | 30' | MgAg | <1 |
| 21 | 33' | MgAg | <1 |
| 22 | 34' | Au | <1 |
| 23 | 35' | Cu | <1 |
| 24 | 36' | ITO | <1 |
| 25 | 37' | Au | <1 |
| 26 | 41' | Au | <1 |
| 27 | 44' | ITO | <1 |
| 28 | 46' | Cu | <1 |
| 29 | 38' | Au | <1 |

Example 30

The organic TFT 10B of the second embodiment shown in FIG. 3 was fabricated in the following procedures.

The source electrode 12 having thickness of 200 nm was formed by vacuum-deposition of gold on the substrate 11. Then, the compound [1] was deposited on the source electrode 12 to form a part of the organic film 15 having thickness of 100 nm. The striped gate electrodes 14 having width of 100 μm, interval of 200 μm and thickness of 80 nm were formed by vacuum-deposition of aluminum on the organic film 15 through a metal mask. Then, the compound [1'] was deposited on the gate electrodes 14 to form other part of the organic film 15 having thickness of 150 nm Further, gold was vacuum-deposited on the organic film 15 to form the drain electrode 13 having thickness of 200 nm, thereby fabricating the organic TFT 10B.

A rectangular pulse voltage having a frequency of 1 kHz and a maximum voltage of 8.5 V was applied to the gate electrode 14 and a dc voltage of 10 V was applied between the source and the drain electrodes of the organic TFT 10B thus fabricated. A response rise-time of the on-state between the source-drain electrodes was measured to be below 1 μs.

Example 31

The organic TFT was fabricated in accordance with the procedures of Example 30 except that the compound (3') was used in place of the compound (1'), and MaAg was used as the respective electrode materials. The response rise-time of the on-state between the source-drain electrodes was measured to be below 1 μs similarly to Example 31.

Example 32

The organic TFT was fabricated in accordance with the procedures of Example 31 except that the compound (5') was used in place of the compound (3'). The response rise-time of the on-state between the source-drain electrodes was measured to be below 1 μs similarly to Example 31.

Examples 33 to 58

The organic TFTs were similarly fabricated in accordance with the procedures of the Examples 30 to 32 in which the numbers of the formulae of the compounds used and the materials of the source electrode and the drain electrode (electrode material) were as specified in Table 2. The response times of each of these organic TFTs were summarized in Table 2.

As apparent from Table 2, the response times of the organic TFTs of Examples 33 to 58 were significantly short, or below 1 μs.

TABLE 2

| Example | No. of Compound | Electrode Material | Response Time (μs) |
|---|---|---|---|
| 33 | 8' | MgAg | <1 |
| 34 | 10' | MgAg | <1 |
| 35 | 14' | MgAg | <1 |
| 36 | 15' | Au | <1 |
| 37 | 16' | Au | <1 |
| 38 | 18' | Cu | <1 |
| 39 | 19' | Au | <1 |
| 40 | 20' | ITO | <1 |
| 41 | 22' | Cu | <1 |
| 42 | 23' | Au | <1 |
| 43 | 24' | ITO | <1 |
| 44 | 25' | Au | <1 |
| 45 | 26' | Au | <1 |
| 46 | 27' | ITO | <1 |
| 47 | 28' | Cu | <1 |
| 48 | 29' | MgAg | <1 |
| 49 | 30' | MgAg | <1 |
| 50 | 33' | MgAg | <1 |
| 51 | 34' | Au | <1 |
| 52 | 35' | Cu | <1 |
| 53 | 36' | ITO | <1 |
| 54 | 37' | Au | <1 |
| 55 | 41' | Au | <1 |
| 56 | 44' | ITO | <1 |
| 57 | 46' | Cu | <1 |
| 58 | 38' | Au | <1 |

Example 59

The organic TFT 10A shown in FIG. 2 was fabricated in accordance with the following procedures.

The gate electrode 14, the dielectric layer 16 and the source electrode 12 were formed on the substrate 11 in accordance with the procedures of Example 1. After the mixture of the compound (1') and cerium in a weight ratio of 10:1 was deposited on the source electrode 12 and the dielectric layer 16 to form a film having thickness of 20 nm, the compound (1') was vacuum-deposited thereon to form the organic layer having thickness of 280 nm. Further, magnesium-silver alloy was vacuum-deposited on the organic film 15 to form the drain electrode 13 having thickness of 200 nm, thereby fabricating the organic TFT 10A.

A rectangular pulse voltage having a frequency of 1 khz and a maximum voltage of 8.5 V was applied to the gate electrode 14 and a dc voltage of 10V was applied to between the source and the drain electrodes of the organic TFT 10A thus fabricated. A response rise-time (a period of time from 10% change to 90% change with respect to the total change) of the on-state between the source-drain electrodes was measured to be below 1 μs.

Example 60

The organic TFT 10B of the second embodiment shown in FIG. 3 was fabricated in the following procedures.

The source electrode 12 having thickness of 200 nm was formed by vacuum-deposition of magnesium-silver alloy on the substrate 11. After the mixture of the compound (1') and cerium in a weight ratio of 10:1 was deposited on the source electrode 12 and the dielectric layer 16 to form a film having thickness of 20 nm, the compound (1') was vacuum-deposited thereon by thickness of 80 nm. The striped gate electrodes 14 having width of 100 μm, interval of 200 μm in and thickness of 80 nm were formed by vacuum-depositing aluminum on the organic film 15 through a metal mask. Then, the compound (1') was vacuum-deposited on the gate electrodes 14 to form other part of the organic film having thickness of 150 nm. Further, magnesium-silver alloy was vacuum-deposited on the organic film 15 to form the drain electrode 13 having thickness of 200 nm, thereby fabricating the organic TFT 10B.

A rectangular pulse voltage having a frequency of 1 kHz and a maximum voltage of 8.5 V was applied to the, gate electrode 14 and a dc voltage of 10V was applied to between the source and the drain electrodes of the organic TFT 10B thus fabricated. Response rise-times of the on-state and the off-state between the source-drain electrodes were measured to be below 1 μs.

Since the above embodiments are described only for examples, the present invention is not limited to the above embodiments and various modifications or alterations can be easily made therefrom by those skilled in the art without departing from the scope of the present invention.

What is claimed is:

1. An organic thin-film transistor (TFT) comprising:
   an organic film;
   first and second electrodes which are oppositely disposed on upper and lower surfaces of the organic film; and
   a third electrode disposed at a specified distance from each of the first and second electrodes, the third electrode being applied with a voltage to control current flowing from one of the first and the second electrodes to the other through the organic film,
   wherein the organic film includes, in the form of a mixture or a single substance, a compound represented by one of general formulae [1] to [6], and
   wherein each of $R^1$ to $R^{80}$ independently represents a hydrogen atom, halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group or substituted or non-substituted alkoxycarbonyl group or carboxyl group; any two adjacent groups of $R^1$ to $R^{80}$ may form a ring; "$L^1$" represents substituted or non-substituted alkyl group, substituted or non-substituted alkenyl group, substituted or non-substituted cycloalkyl group, substituted or non-substituted aromatic hydrocarbon group, substituted or non-substituted aromatic heterocyclic group or substituted or non-substituted aralkyl group; "$Ar^1$" to "$Ar^3$" represent substituted or non-substituted aromatic hydrocarbon group having carbons from 6 to 20; "n" represents an integer from 1 to 3; "m" represents an integer from 0 to 2; "l" is 0 or 1; "s" is 1 or 2; "t" represents an integer from 0 to 3; and "M" represents a metal ion having a valency of "n+m" or "s+1".

[General Formula 1]
[General Formula 2]
[General Formula 3]
[General Formula 4]
[General Formula 5]
[General Formula 6]

[1]

[2]

[3]

[4]

[5]

[6]

2. An organic thin-him transistor (TFT) comprising:

an organic film;

first and second electrodes which are oppositely disposed on upper and lower surfaces of the organic film; and a third electrode disposed at a specified distance from each of the first and second electrodes, the third electrode being applied with a voltage to control current flowing from one of the first and the second electrodes to the other through the organic film, wherein the organic film includes, in the form of a mixture or a single substance, a compound selected from substituted or non-substituted condensed aromatic hydrocarbons having from 14 to 34 carbon atoms, and wherein said condensed aromatic hydrocarbons are selected from the group consisting of anthracene, phenanthren, naphthacene, picene, pentaphene, hexacene, benzo(a)perylene, dibenzo(a, j) perylene, dibenzo(a, o)perylcne, bisanthrene, pyranthrene, and tetrabcnzo(de, hi, op, st) pentacene.

3. The organic thin-film transistor (TFT) according to claim 1, further comprising:

a dielectric layer formed adjacent to said organic film.

4. The organic thin-film transistor (TFT) according to claim 3, wherein said third electrode is separated from said organic film by said dielectric layer.

5. The organic thin-film transistor (TFT) according to claim 3, wherein said first electrode comprises a plurality of first electrodes.

6. The organic thin-film transistor (TFT) according to claim 5, wherein said plurality of first electrodes are formed on said dielectric layer.

7. The organic thin-film transistor (TFT) according to claim 3, wherein said third electrode is formed on a side of said organic film which is opposite to said dielectric layer.

8. The organic thin-film transistor (TFT) according to claim 1, wherein said third electrode comprises a plurality of third electrodes.

9. The organic thin-film transistor (TFT) according to claim 8, wherein said plurality of third electrodes are formed in said organic material.

10. The organic thin-film transistor (TFT) according to claim 8, wherein said plurality of third electrodes are separated from said first electrode and said second electrode by said organic film.

11. The organic thin-film transistor (TFT) according to claim 8, wherein said plurality of third electrodes are formed parallel to one another and parallel to said first and second electrodes.

12. The organic thin-film transistor (TFT) according to claim 2, wherein a substituent of said condensed aromatic hydrocarbons is selected from a group consisting of a halogen atom, hydroxyl group, substituted or non-substituted ammo group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted arlkoxycarbonyl group, and carboxyl group.

13. The organic thin-film transistor (TFT) according to claim 12, wherein said halogen atom comprises one of fluorine, chlorine, bromine, and iodine.

14. The organic thin-film transistor (TFT) according to claim 1, wherein said organic film has a thickness in a range of 1 nm to 1000 nm.

15. A switching device comprising the organic thin-film transistor (TFT) according to claim 1.

16. A liquid crystal display (LCD) comprising the organic thin-film transistor (TFT) according to claim 1.

17. The organic thin-film transistor (TFT) according to claim 1, wherein said first electrode comprises a source electrode, said second electrode comprise a drain electrode, and said third electrode comprises a gate electrode.

18. The organic thin-film transistor (TFT) according to claim 17, wherein said organic film comprises a channel region, such that a voltage applied to said gate electrode controls a flow of camera between said source and drain electrodes in said channel region.

* * * * *